US012768899B2

(12) United States Patent
Kondo

(10) Patent No.: US 12,768,899 B2
(45) Date of Patent: Oct. 20, 2026

(54) INTELLIGENT POWER MANAGEMENT SYSTEM AND METHOD FOR MONITORING BATTERY INTEGRITY

(71) Applicant: SEMICONDUCTOR COMPONENTS INDUSTRIES, LLC, Scottsdale, AZ (US)

(72) Inventor: Hideo Kondo, Oizumi-machi (JP)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 156 days.

(21) Appl. No.: 18/907,907

(22) Filed: Oct. 7, 2024

(65) Prior Publication Data

US 2026/0098909 A1 Apr. 9, 2026

(51) Int. Cl.

| | |
|---|---|
| ***G01R 31/392*** | (2019.01) |
| ***G01R 31/371*** | (2019.01) |
| ***G01R 31/3842*** | (2019.01) |
| ***G01R 31/389*** | (2019.01) |
| ***H01M 10/42*** | (2006.01) |
| ***H01M 10/48*** | (2006.01) |

(52) U.S. Cl.

CPC ......... *G01R 31/392* (2019.01); *G01R 31/371* (2019.01); *G01R 31/3842* (2019.01); *G01R 31/389* (2019.01); *H01M 10/425* (2013.01); *H01M 10/4285* (2013.01); *H01M 10/486* (2013.01); *H01M 2010/4271* (2013.01)

(58) Field of Classification Search

USPC ........................................................ 324/430

See application file for complete search history.

(56) References Cited

U.S. PATENT DOCUMENTS

| | | | | |
|---|---|---|---|---|
| 8,519,674 B2 * | 8/2013 | Anderson | ............ | G01R 31/392 320/132 |
| 10,594,145 B1 | 3/2020 | Wang et al. | | |
| 11,623,526 B2 * | 4/2023 | Stefanopoulou | .......... | B60L 3/12 324/427 |
| 2010/0001693 A1 | 1/2010 | Iida et al. | | |
| 2010/0045298 A1 | 2/2010 | Iwane et al. | | |
| 2012/0200266 A1 | 8/2012 | Berkowitz et al. | | |
| 2014/0009123 A1 | 1/2014 | Park et al. | | |
| 2014/0021959 A1 | 1/2014 | Maluf et al. | | |
| 2019/0202299 A1 | 7/2019 | Oh et al. | | |
| 2022/0283239 A1 | 9/2022 | Kondo | | |
| 2024/0125865 A1 | 4/2024 | Li et al. | | |

FOREIGN PATENT DOCUMENTS

| | | |
|---|---|---|
| DE | 202018004513 U1 | 3/2019 |
| WO | WO2014083168 A1 | 6/2014 |

* cited by examiner

*Primary Examiner* — Farhana A Hoque

(74) *Attorney, Agent, or Firm* — Quinn IP Law

(57) ABSTRACT

A battery monitoring system for a battery of a battery electric system includes a sensor array, a processor, and memory. Execution of the instructions by a processor according to a method causes the processor to receive parameters of the battery from the sensor array, calculate a rate of increase of an internal resistance (ΔR ratio) of the battery across multiple states of charge of the battery, compare the ΔR ratio to one or more degradation thresholds, and record a corresponding degradation level of the battery in the memory when the ΔR ratio exceeds the degradation threshold(s). A state of health notice may be transmitted to a remote device.

20 Claims, 7 Drawing Sheets

INTELLIGENT POWER MANAGEMENT SYSTEM AND METHOD FOR MONITORING BATTERY INTEGRITY

INTRODUCTION

The present disclosure relates to electrical circuit topologies and control methods for monitoring the performance and structural integrity of an electrochemical battery. Electric vehicles, standby power supplies, power stations, and other mobile and stationary battery electric systems utilize rechargeable batteries as direct current (DC) energy storage devices. For example, lithium-ion batteries are commonly used to power electric motors in a myriad of industries, as well as to energize actuators, sensors, displays, and control circuits of medical devices, industrial systems, and consumer products.

While lithium-ion batteries and other high-energy batteries are integral components of modern battery electric systems, their use comes with potential risks. Over time, age-related degradation can reduce the battery's reliability and performance. Relative to new/properly functioning batteries, the internal temperature of a degraded battery can rapidly increase. Thermal management techniques such as coolant/air circulation or the use of heat sinks or cell vents are therefore used to help regulate battery temperature. However, when the temperature of a battery cell increases beyond a certain point, the materials of the battery and its constituent battery cells may begin to melt or burn. In turn, the resulting increased pressure levels within the battery cell can cause an outer cell can or foil to rupture. When rupture happens, the battery cell may expel high-temperature gasses, molten materials, soot, and other ejecta, which can propagate to neighboring battery cells. This thermal runaway condition can adversely affect operation of the battery and the battery electric system.

SUMMARY

Disclosed herein are battery monitoring systems and automated methods for monitoring the state of health of an electrochemical battery within a battery electric system. While a representative lithium-ion battery is described herein, the present teachings are not limited to lithium-based batteries. Rather, the solutions described below may be extended to other battery constructions, such as but not limited to nickel-cadmium (NiCd), nickel-metal hydride (NiMH), lead acid, etc.

The monitoring strategy set forth herein seeks to protect the battery electric system and any surrounding surfaces from thermal damage. This objective is accomplished by detecting a potentially hazardous degradation state of the battery via an electronic monitoring unit (EMU). As detection occurs prior to an actual manifestation of the hazard, the present teachings enable proactive issuance of an alert as advanced warning of an impending battery failure. Sufficient time is thus afforded for performing preventive actions such as battery replacement or circuit disconnection, with the EMU performing one or more such control actions in accordance with aspects of the present disclosure.

In a particular embodiment, a system for monitoring a battery of a battery electric system includes a sensor array, a processor, and a non-transitory computer-readable storage medium ("memory"). The sensor array is configured to measure a voltage, a current, and a temperature of the battery as a set of battery parameters. The memory includes instructions that are executable by the processor. Execution of the instructions causes the processor to receive the battery parameters from the sensor array during a predetermined operating mode of the battery, and to calculate a rate of increase of an internal resistance of the battery across multiple states of charge of the battery. This rate of increase is referred to herein as a delta resistance (ΔR) ratio. The processor is also caused to determine a degradation level of the battery using the ΔR ratio, and to record the degradation level of the battery in the memory.

Execution of the instructions may also cause the processor to execute a control action of the battery in response to the degradation level. In one or more embodiments, for instance, the control action includes transmitting a state of health (SOH) notice to a remote device, for instance a server or a smartphone in networked communication with the processor/EMU.

In other implementations, the processor calculates first and second internal resistances (R1 and R2) of the battery at respective first and second states of charge (SOC-1, SOC-2) of the battery using the battery parameters. The ΔR value may include a ΔR ratio, with the ΔR ratio being a function ($f$) of the first internal resistance (R1) and the second resistance (R2). $f=(R2-R1)/R1\times100\%$ in a possible implementation.

Execution of the instructions may also cause the processor to compare the ΔR ratio to (i) a first degradation threshold corresponding to negligible degradation level of the battery; (ii) a second degradation threshold corresponding to a minor degradation level of the battery; (iii) a third degradation threshold corresponding to a moderate degradation level of the battery; and (iv) a fourth degradation threshold corresponding to a severe degradation level of the battery. Such thresholds are based on the ΔR ratio. In a non-limiting example embodiment, the first degradation threshold is about 25% to about 35%, the second degradation threshold is about 45% to about 55%, the third degradation threshold is about 55% to about 65%, and the fourth degradation threshold is about 80% to about 90%.

The battery may be constructed in one or more embodiments as a lithium-ion battery pack. In this instance, the processor may calculate the ΔR value of the battery across the first SOC (SOC-1) of, e.g., about 50%, and the second SOC (SOC-2) of about, e.g., 10%, with the different states of charge of the battery including the first and second SOC (SOC-1, SOC-2).

The battery monitoring system may optionally include an electrical disconnect switch. The battery in such an embodiment is connectable to a load via the disconnect switch. The processor commands the disconnect switch to open and thereby disconnect the battery from the load, with this control action occurring in response to the determined degradation level of the battery. The load in some implementations is part of the battery electric system.

Also disclosed herein is a method for monitoring a battery in a battery electric system. The method in one or more implementations includes measuring a set of battery parameters of the battery using a sensor array of a battery monitoring system, as well as calculating, via a processor, a rate of increase of an internal resistance (ΔR value) of the battery across different states of charge of the battery. The method further includes comparing the ΔR value to one or more predetermined degradation thresholds. An EMU/processor records a corresponding degradation level of the battery in a computer readable storage medium/memory when the ΔR value exceeds one or more of the degradation thresholds.

A battery electric system is also disclosed herein. In accordance with an embodiment, the battery electric system includes an electrical disconnect switch, a battery connectable to a load via the disconnect switch, a sensor array, and an EMU. The sensor array is configured to measure a voltage, a current, and a temperature of the battery as battery parameters. The EMU is configured to perform the above-summarized method, including calculating the first and second internal resistances (R1 and R2) of the battery at the respective first and second state of charge (SOC-1 and SOC-2) of the battery using the battery parameters, with the first state of charge (SOC-1) exceeding the second state of charge (SOC-2).

The above summary is not intended to represent every embodiment or aspect of the present disclosure. Rather, the summary exemplifies certain novel aspects and features. Such features will be apparent from the following detailed description of representative embodiments and modes for carrying out the present disclosure when taken in connection with the accompanying drawings and the appended claims.

BRIEF DESCRIPTION OF THE DRAWINGS

The drawings described herein are for illustrative purposes, are schematic in nature, and are exemplary rather than limiting of the scope of the disclosure.

Figure 1:
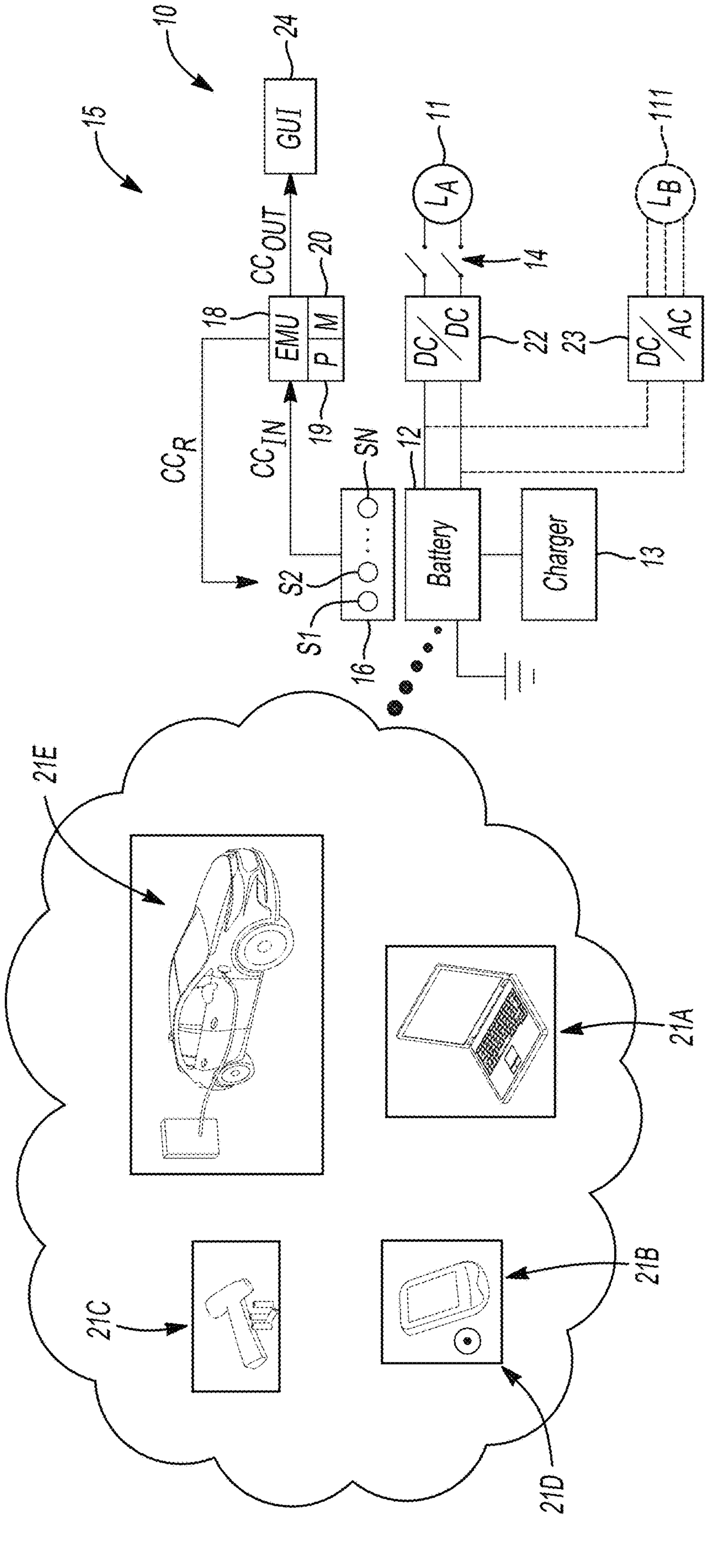
FIG. 1 illustrates a battery electric system having a rechargeable battery and a battery monitoring system constructed in accordance with the present disclosure.

The present disclosure may be modified or embodied in alternative forms, with representative embodiments shown in the drawings and described in detail below. Inventive aspects of the present disclosure are not limited to the disclosed embodiments. Rather, the present disclosure is intended to cover alternatives falling within the scope of the disclosure as defined by the appended claims.

DETAILED DESCRIPTION

With reference to the drawings, wherein like reference numbers refer to the same or similar components throughout the several views, a battery electric system 10 is illustrated schematically in FIG. 1. The battery electric system 10 in a simplified embodiment includes a rechargeable battery 12, the degradation level and state of health (SOH) of which is monitored in accordance with the disclosure. As noted above, battery degradation is associated with various potential risks, including possible overheating, battery failure, or thermal runaway. The present strategy therefore enables earlier detection and treatment of potentially hazardous states of the battery 12, with the strategy as set forth in detail below doing so by sensing an increase in internal resistance across different capacity ranges.

The exemplary battery electric system 10 of FIG. 1 includes an electrical disconnect switch 14, a direct current (DC)-powered load (LA) 11, and a battery monitoring system 15. The battery monitoring system 15 in turn includes a sensor array 16 and an electronic monitoring unit (EMU) 18. The sensor array 16 is electrically connectable to the battery 12, for instance via one or more hard-wired transfer conductors and/or wireless pathways/network connections.

The EMU 18 in accordance with the present disclosure includes a processor (P) 19 and a non-transitory computer-readable storage medium ("memory") (M) 20. The memory 20 includes instructions recorded thereon and executable by the processor 19 to cause the EMU 18 to perform a method 50, a non-limiting example implementation of which is described below with reference to FIG. 7. Among other actions, the EMU 18 transmits a measurement request signal (CCR) to the sensor array 16 to initiate the present battery monitoring process.

The battery 12, which is described hereinafter as a representative lithium-ion (Li) solely for illustrative consistency, may be alternatively configured with a different rechargeable battery chemistry in other embodiments, for instance lithium metal oxide (LMO), lithium-metal, nickel-metal hydride (NiMH), nickel-cadmium (NiCd), etc. In various implementations, the battery electric system 10 of FIG. 1 can be used as part of a mobile or stationary battery-powered device. As shown in FIG. 1, the battery 12 may be used to power a portable electronic device such as a computer 21A, e.g., a tablet, desktop, or laptop computer, or a cellular phone 21B.

Other applications may use the battery 12 as part of a medical device, for instance a handheld surgical tool 21C or a wearable device 21D. The optional wearable device 21D may be constructed as a continuous glucose monitor (CGM) as shown, or alternatively as an automatic external defibrillator (AED), a blood oxygen monitor, or an infusion pump, among other possibilities. Likewise, the battery 12 may be used to energize a mobile system 21E such as an electric vehicle, which is illustrated in FIG. 1 as it might appear when undergoing a battery charging process. Still other applications may be readily envisioned, including but not limited to electronic gaming systems, control consoles, or other industrial, medical, or transportation systems. The exemplary use, chemistry, construction, and simplified depiction of the battery 12 herein is therefore illustrative of the present teachings and non-limiting thereof unless otherwise specified.

The representative battery monitoring system 15 of FIG. 1 may include other components in different embodiments. For example, a direct current-to-direct current (DC-DC) converter 22 may be used with the battery 12 to increase or reduce the battery voltage before energizing the connected load 11. A battery charger 13 may be connectable to the battery 12 and used to recharge the battery 12 as needed. In an alternating current (AC) configuration of the battery electric system 10, the battery 12 may be connected to a DC-to-AC inverter circuit 23, with the inverter circuit 23 operable for outputting an AC waveform to a coupled AC-powered load (LB) 111. The loads 11 and 111 may be variously embodied as electric motors, rotary actuators, linear actuators, displays, transducers, and/or other electrical or electromechanical devices depending on the application.

As part of the present battery monitoring strategy, various sensors S1, S2, . . . , SN of the sensor array 16 are used to measure or sense battery parameters during charging and discharging modes of the battery 12, with "N" being an integer representing an arbitrary $N^{th}$ sensor in the sensor array 16. The battery parameters measured and used as part of the method 50 exemplified in FIG. 7 include at least a voltage, a current, and a temperature of the battery 12, with the EMU 18 of FIG. 1 also being configured to determine the state of charge (SOC) and an open-circuit voltage (OCV) of the battery 12 and its present charge/discharge state.

As part of the contemplated battery monitoring process described herein, input signals ($CC_{IN}$) from the sensor array 16 are communicated to the EMU 18. The EMU 18 thereafter outputs electronic control signals ($CC_{OUT}$) to a remote device 24, e.g., a graphical user interface (GUI) as labeled in FIG. 1, and/or a display screen, the disconnect switch 14, etc. The disconnect switch 14, which may be placed elsewhere in the schematic circuit of FIG. 1, including between the inverter circuit 23 and the AC-powered load 111 in such embodiments, may be variously embodied as electromechanical contactors or relays, e.g., solid state relays (SSRs), operable to disconnect the battery 12 under certain fault conditions.

Although omitted from FIG. 1 for illustrative simplicity and clarity, the battery electric system 10 may also be equipped with a thermal management system as summarized above to help regulate temperature of the battery 12 during its normal operation, for example cooling plates, fins, heat sinks, coolant conduit, etc. Likewise, other circuit components such as fuses may be implemented to ensure the safety and reliability of the battery electric system 10 during its operation.

Figure 2C:
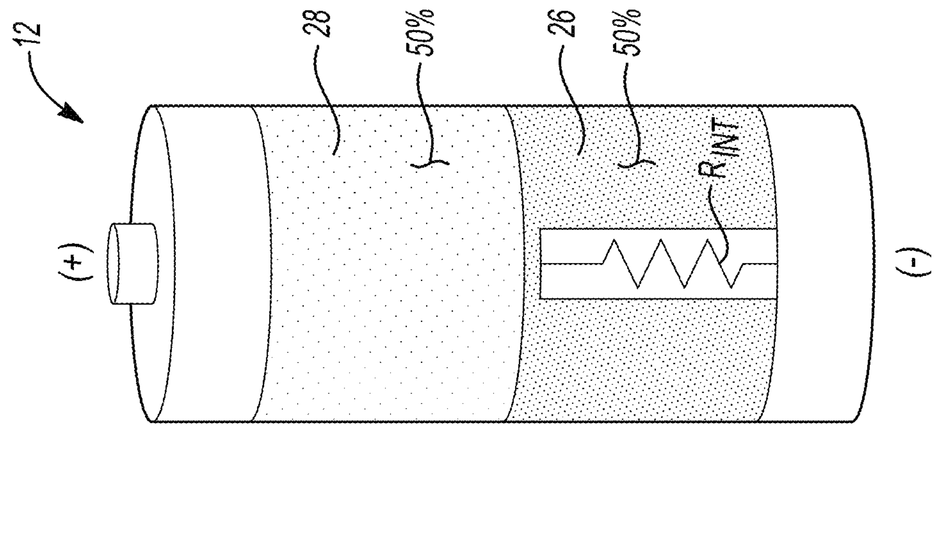
FIGS. 2A, 2B, and 2C illustrate a representative embodiment of the battery shown in FIG. 1 for various capacity levels.
Figure 2B:
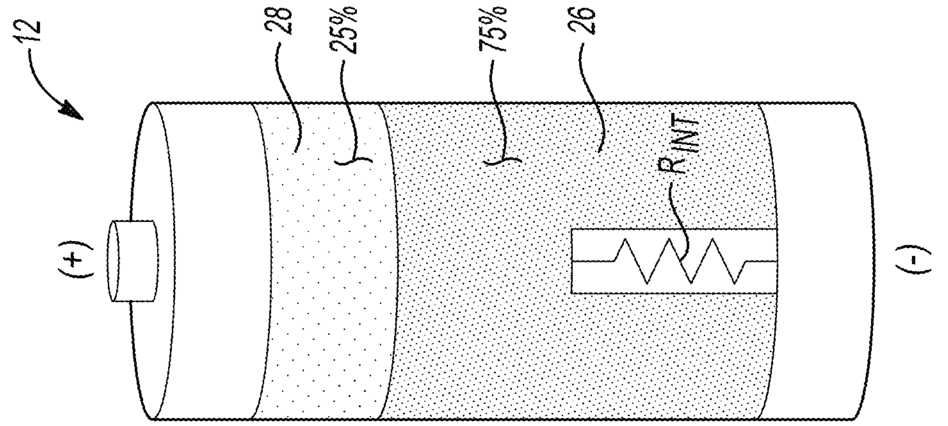
Figure 2A:
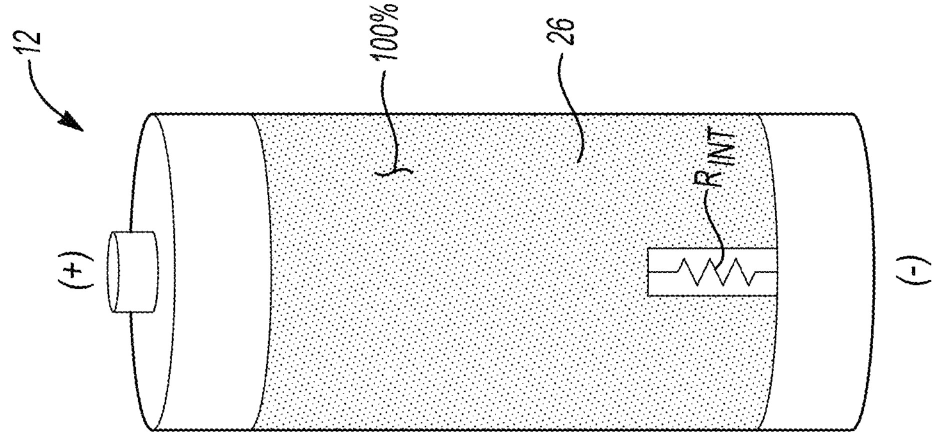

FIGS. 2A, 2B, and 2C collectively illustrate the battery 12 in the non-limiting representative form of a cylindrical battery cell having positive (+) and negative (−) terminals. FIGS. 2A, 2B, and 2C depict three distinct levels of charge depletion and corresponding internal resistances of the representative battery 12 due to age-related or other degradation. FIG. 2A depicts a new/properly functioning battery 12 having a useable nominal usable capacity 26 of 100% and an internal resistance ($R_{INT}$). Progressive aging and deterioration of the battery 12 is illustrated in FIGS. 2B and 2C for nominal usable capacities 26 of 75% and 50%, respectively, corresponding to respective unusable capacities 28 of 25% (FIG. 2B) and 50% (FIG. 2C). Relative to the new state of the battery 12 shown in FIG. 2A, the internal resistance ($R_{INT}$) of the battery 12 in FIG. 2B has increased, in this exemplary instance to $$\frac{4}{3}R_{INT}.$$

As degradation of the battery 12 continues, the internal resistance ($R_{INT}$) may continue to increase, in this exemplary case to twice the level of FIG. 2A, i.e., $2R_{INT}$. In other words, age-related degradation of the battery 12 leads to a significant increase its internal resistance. This change in internal resistance is used herein as part of the method 50 of FIG. 7 to help diagnose degradation states of the battery 12 and proactively enable proactive responses as needed.

Figure 3B:
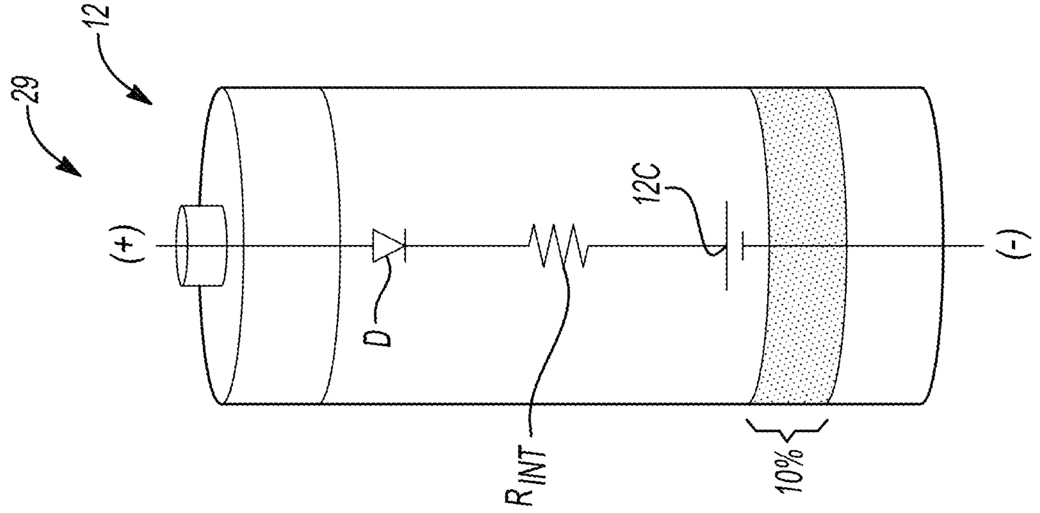
FIGS. 3A and 3B illustrate models of a representative battery in a new or properly functioning state.
Figure 3A:
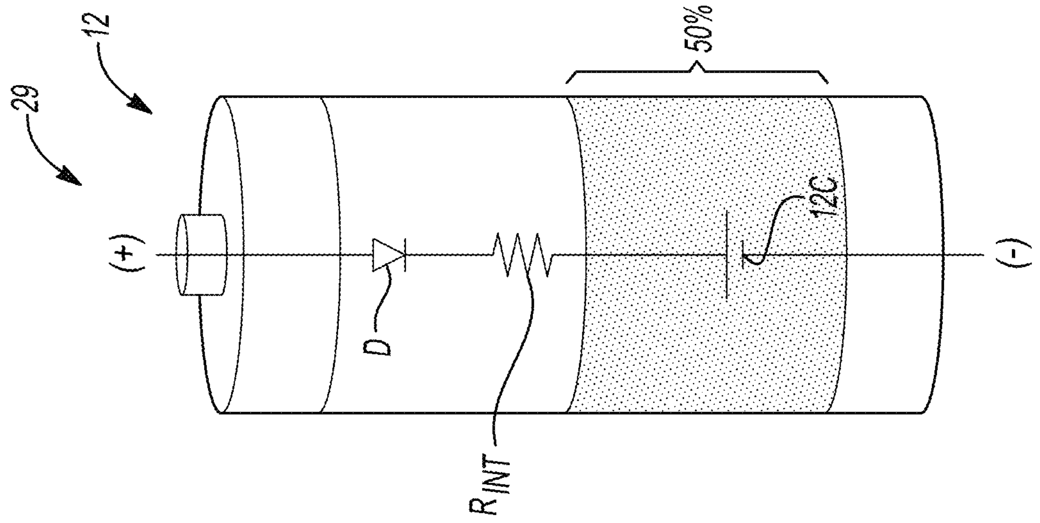

Referring to FIGS. 3A and 3B, a battery model 29 is used herein as part of the present strategy. The above-noted internal resistance ($R_{INT}$) of the battery 12 represents the internal resistance of the battery 12 as determined during a predetermined operating mode of the battery 12. Such a mode may be a charging mode, during which an offboard charging station (not shown) offloads a charging current to the battery 12 to increase the state of charge/capacity of the battery 12. Battery monitoring may be performed during a discharging mode of the battery 12 in other embodiments, however, and therefore implementation of the present teachings is not limited to the charging mode.

As shown in FIG. 3A, the internal resistance ($R_{INT}$) for the battery 12 is determined herein using the above-noted battery parameters, i.e., voltage, current, and temperature. For example, the internal resistance may be determined at a state of charge (SOC) of about 50% as shown, with this value corresponding to the first state of charge (SOC-1). This calculation is then repeated at a different second SOC (SOC-2), e.g., 10% as shown in FIG. 3B, with the first state of charge exceeding the second, i.e., SOC-1>SOC-2 in this example. 50% and 10% are suitable for lithium-ion constructions of the battery 12 and are thus exemplary and non-limiting. For the same 50% and 10% SOC levels, however, the internal resistance will differ for a degraded battery 12 relative to a properly functioning/new one.

In terms of general battery physics, charging operations of a lithium-ion construction of the battery 12 will cause lithium ions to migrate within the battery 12 and be absorbed onto electrode surfaces. This process is generally stable for a new battery 12. However, abnormal growth and formation of unstable lithium deposits can result from repeated charging cycles and/or increased charging rates, e.g., during repeated DC fast charging of the battery 12. Clusters of deposits can form elongated branch-like structures, i.e., dendrites. Dendrites and other lithium accumulations increase the internal resistance, and thus internal resistance may be used herein as an indicator of degradation level of the battery 12.

Therefore, the battery 12 illustrated in FIGS. 3A and 3B may display internal resistances at different states of charge that are indicative of negligible degradation of the battery 12, or intermediate levels such as minor degradation, moderate degradation, etc., up to severe degradation of the battery 12. Corresponding thresholds may be recorded in the memory 20 of FIG. 1 and used to determine the degradation level of the battery 12. In keeping with the example in which the first state of charge (SOC-1) is about 50% and the second state of charge (SOC-2) is about 10% example, an increase in internal resistance of, e.g., about 30-35% may correspond to negligible degradation, while an increase in internal resistance of, e.g., 80-90% at the same two SOC levels may correspond to severe degradation. The EMU 18 of FIG. 1, using such analysis, may thereafter initiate control or corrective actions as needed to protect the battery 12, the battery electric system 10, and users thereof.

Figure 4:
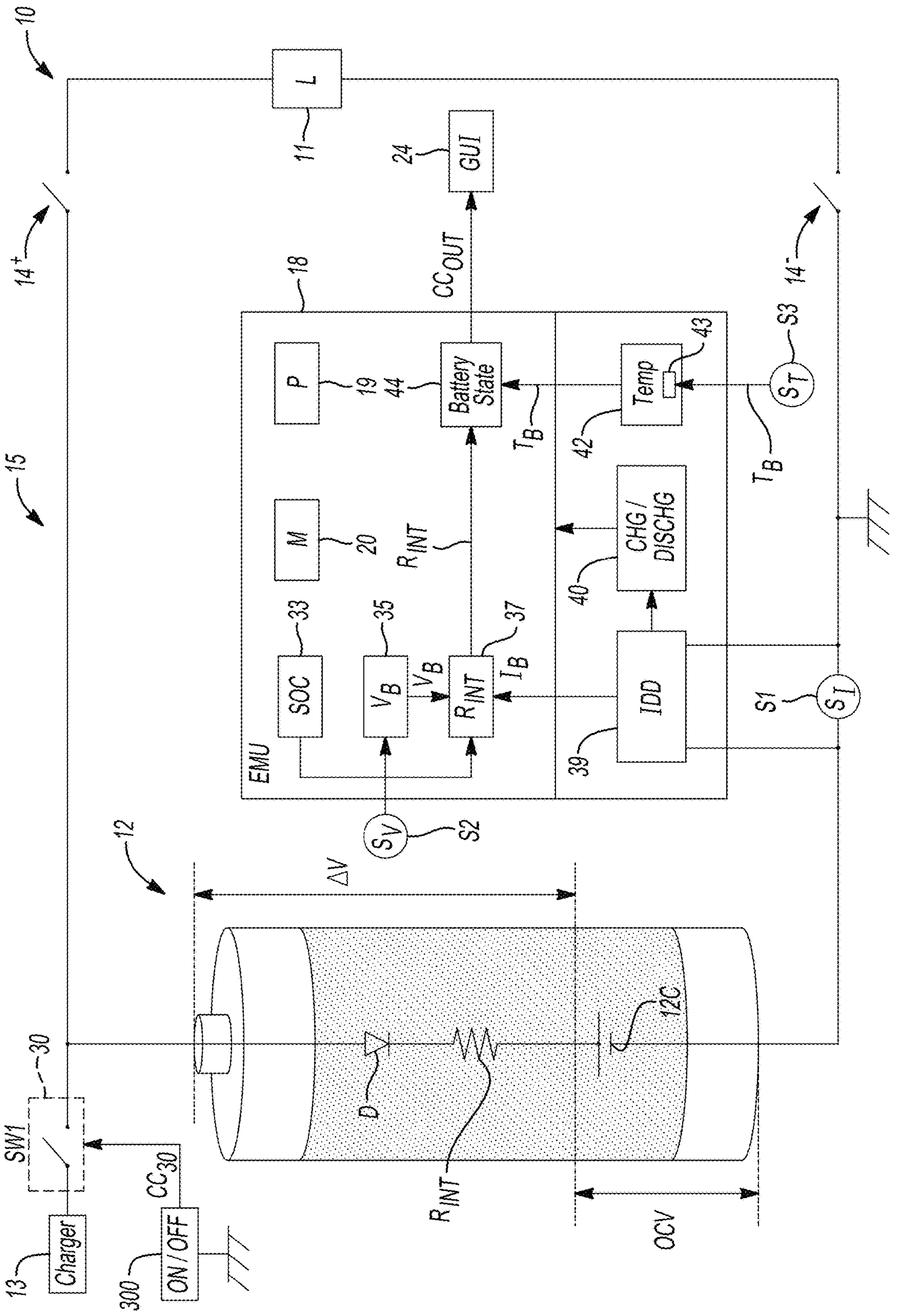
FIG. 4 is a schematic circuit diagram of the battery monitoring system of FIG. 1 in accordance with a possible embodiment.
Figure 5:
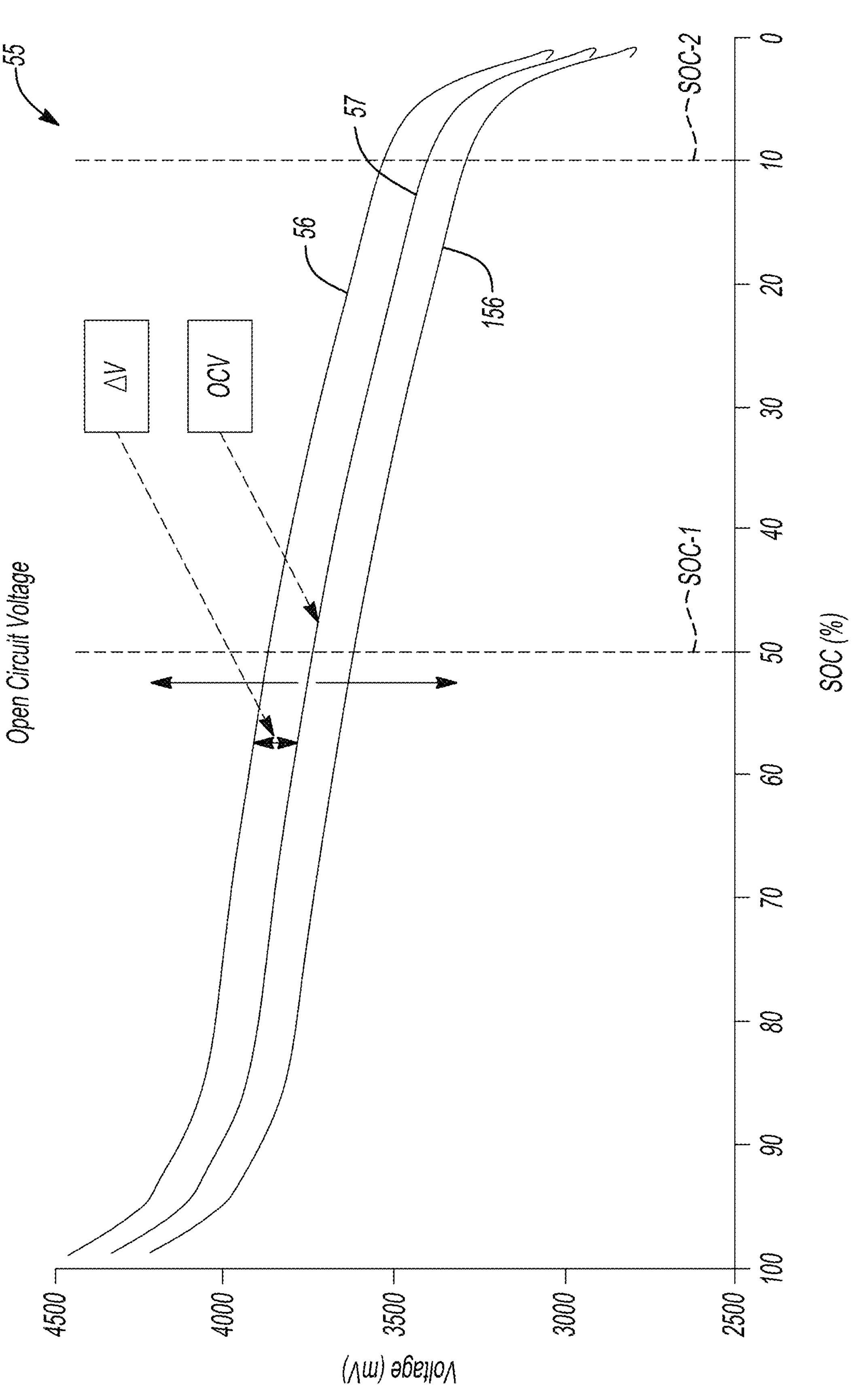
FIG. 5 illustrates changing capacity-based cell voltages, with voltage depicted on the vertical axis and percentage state of charge (SOC)/remaining capacity depicted on the horizontal axis.

Referring to FIG. 4, portions of the battery electric system 10 of FIG. 1 are illustrated schematically as the battery monitoring system 15 and the load (L) 11. Open circuit voltage (OCV) is illustrated along with a voltage difference (ΔV). As shown in the representative voltage plot 55 of FIG. 5, battery voltage in millivolts (mV) is illustrated along with capacity of the battery 12 of FIG. 4. Remaining capacity is expressed in FIG. 5 as an SOC percentage (%), e.g., the first SOC (SOC-1) is 50% and the second SOC (SOC-2) is 10%. Traces 56 and 156 represent the battery voltage during respective charge and discharge modes of the battery 12 for a given temperature. Movement between traces 56 and 156 represents the voltage difference (ΔV) relative to a baseline, in this case the above-noted open circuit voltage (OCV). For a given temperature and capacity, therefore, OCV acts as a stable reference from which the voltage difference (ΔV) may be determined. As appreciated in the art, the OCV, e.g., from a temperature-specific lookup table referenced or indexed by SOC and OCV, may be used to determine the voltage difference (ΔV) as shown, for either charging or discharging modes. That is, ΔV is the difference in a measured battery voltage and the OCV, i.e., $\Delta V=V_M-OCV$.

Referring again to FIG. 4, the battery 12 is disconnected from the load 11 during charging via opening of the disconnect switch 14, i.e., one or both disconnect switches $14^+$ and/or $14^-$, with + and − respectively indicating connection to positive and negative voltage rails of the battery electric system 10. An optional charging switch (SW1) 30 may be commanded to close, e.g., by the EMU 18 or another charging controller 300, as indicated by arrow $CC_{30}$ and corresponding label "ON/OFF". This action electrically connects the battery 12 to the battery charger 13. As appreciated in the art, the battery charger 13 may be connected to an offboard power supply (not shown), such as grid power. When the power supply is an AC outlet, the battery charger 13 includes an AC-to-DC converter operable to convert, filter, and output suitable DC voltage and current waveforms to the battery 12 for charging.

A current sensor ($S_I$) S1, which is a component of the sensor array 16 of FIG. 1 described above, may be used to detect the direction of current flow. This information would help determine whether the battery 12 is in a charging mode or a discharging mode as the above-noted predetermined operating mode. The battery 12 is then removed from the battery charger 13 when the battery 12 is in use (discharging mode), with removal of the battery 12 from the battery charger 13 automatically opening the charging switch 30.

Figure 7:
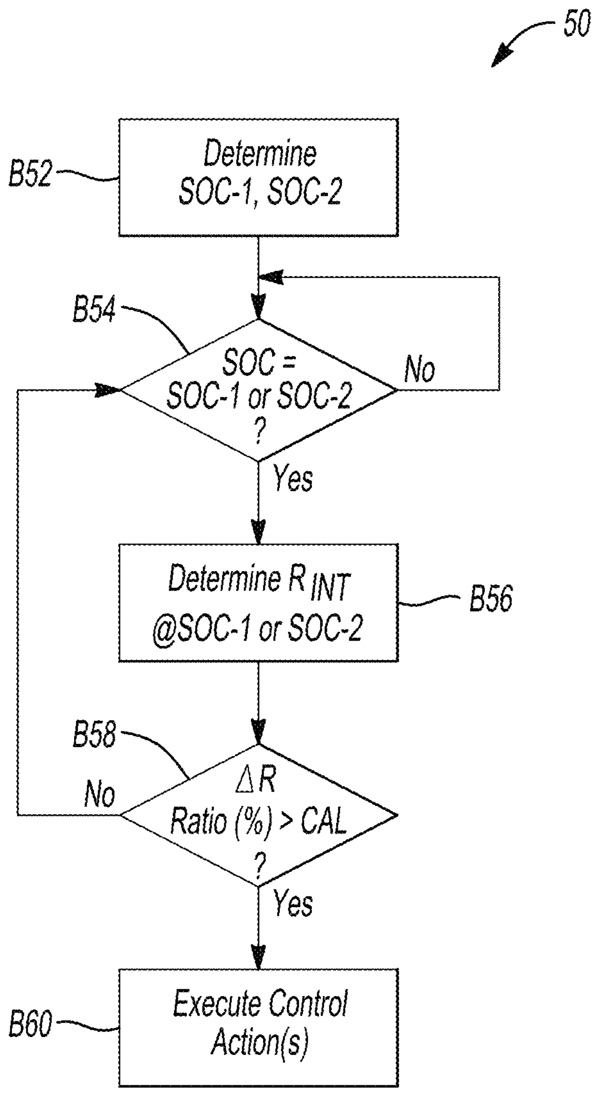
FIG. 7 is a flow chart describing a method for monitoring the battery of the battery electric system of FIG. 1.

In a possible implementation of the EMU 18, corresponding hardware and software modules or blocks may be implemented to perform the requisite processing functions of the method 50 (see FIG. 7). A state of charge (SOC) block 33 may be used to determine the present SOC of the battery 12. The SOC block 33 may be implemented in several ways, such as but not limited to Coulomb counting. Using such an approach, electric current flowing into and out of the battery 12 over time is closely tracked and integrated to determine the amount of transferred charge. Other approaches may include, e.g., machine learning, voltage and temperature-based lookup tables, temperature-specific OCV-SOC tables or curves, or other possible approaches.

The EMU 18 of FIG. 4 may also include a voltage measurement block (VB) 35. This feature may be implemented using a voltage sensor ($S_V$) S2 of the sensor array 16 (FIG. 1), with the measured voltage periodically measured and communicated to the voltage measurement block 35 and stored in non-volatile portions of the memory 20 of FIG. 1. An internal resistance calculation block 37 receives the measured battery voltage (VB) and uses this parameter to calculate the internal resistance ($R_{INT}$) as described below, along with a measured current value from a current measurement block (IDD) 39. The current sensor S1 likewise measures and communicates a measured current value IB to the internal resistance calculation block 37, and possibly to a charge/discharge detection block (CHG/DISCHG) 40 to determine when the battery 12 is charging or discharging. This may be accomplished by detecting the current flow direction through the battery 12.

The EMU 18 of FIG. 4 also considers battery temperature ($T_B$) in evaluating the degradation level and state of health of the battery 12. To that end, the EMU 18 is equipped with a temperature measurement block (Temp) 42 which is in communication with a temperature sensor ($S_T$) S3, e.g., a thermistor or thermocouple. The measured battery temperature ($T_B$) may be requested by, communicated to, and recorded by the temperature measurement block 42, possibly with assistance of an analog-to-digital converter 43. The measured battery temperature ($T_B$) is then communicated to a battery state block 44 operable for determining a degradation level and state of health of the battery 12. The EMU 18 performs this function using the internal resistance ($R_{INT}$) as discussed above.

Actions may be taken by the EMU 18 when the internal resistance ($R_{INT}$) is high relative to one or more degradation thresholds as described below. This may occur when a rate of increase of the internal resistance of the battery 12 across different states of charge of the battery 12, i.e., the delta resistance (ΔR) value, exceeds one or more predetermined degradation thresholds corresponding to different degradation levels of the battery 12. In such a case, the EMU 18 may communicate alerts via the output signals ($CC_{OUT}$), for instance to the GUI 24 or another external audio and/or visual device.

Depending on the application, the alerts may entail audible alarms, indicator lights, text messages, haptic feedback, and the like, which may include a request to discard or replace the battery 12. When the EMU 18 determines that failure of the battery 12 is imminent, the EMU 18 may take other preventive measures such as disconnecting the load 11 or preventing charging via the battery charger 13. Such actions may help prevent thermal damage to the surrounding environment or, for wearable versions of the battery electric system 10, to a user of the wearable device 21D of FIG. 1.

Figure 6:
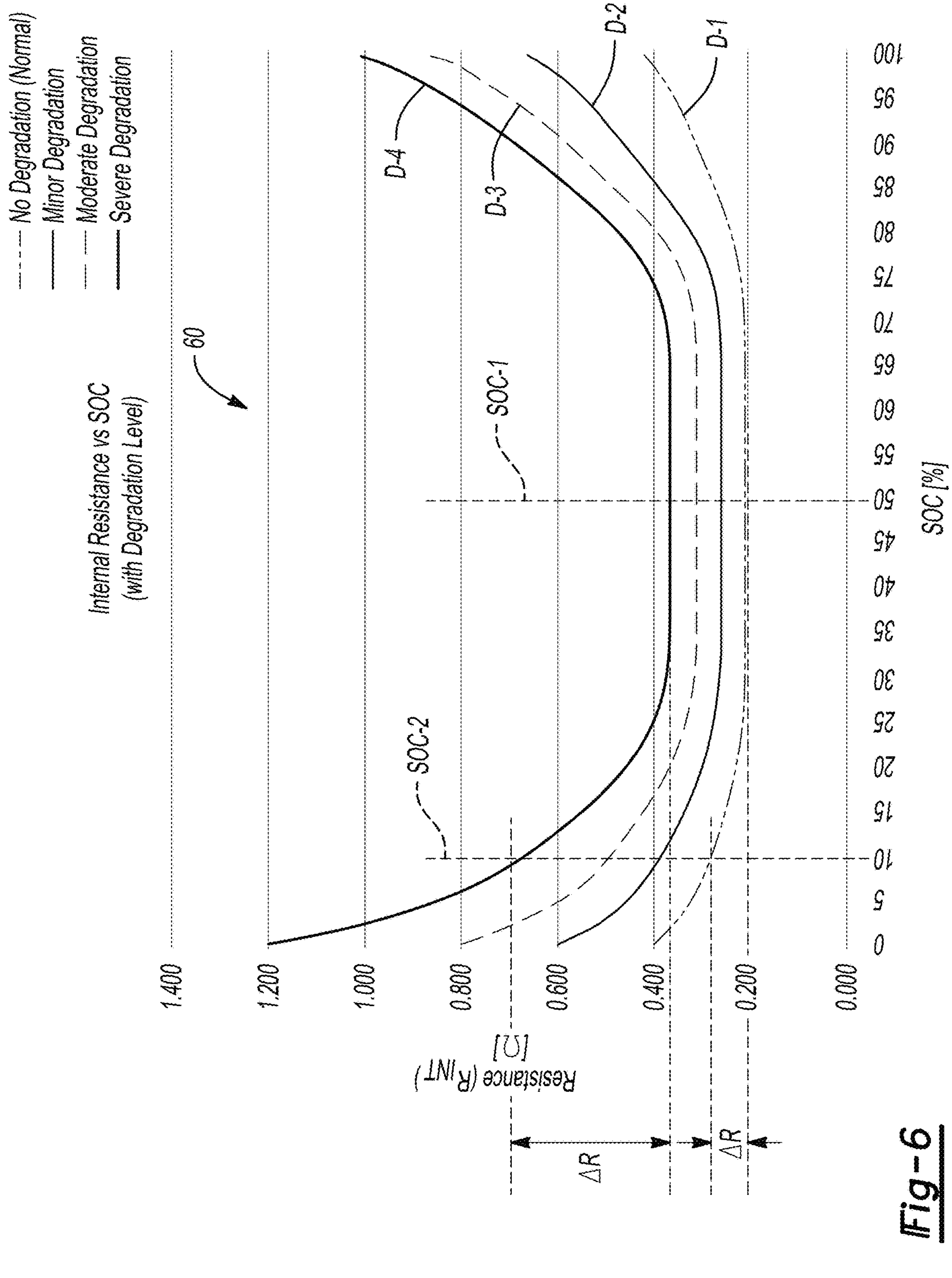
FIG. 6 illustrates SOC-based variations in internal resistance ($R_{INT}$), with the percentage capacity or SOC shown on the horizontal axis and ohmic resistance shown on the vertical axis.

FIG. 6 illustrates, via a set of traces 60, the internal resistance ($R_{INT}$) in ohms (2) for a given state of charge (SOC) of the battery 12 at a particular temperature, e.g., 25° Celsius. As with the prior example, the first SOC (SOC-1) and the second SOC (SOC-2) are set to 50% and 10%, respectively, without limiting applications to these representative values. The traces 60, or alternatively a lookup table or other reference, may be recorded in memory 20 of FIG. 1 and accessed by the processor 19 when performing the present method 50 of FIG. 7. The traces 60 are labeled D-1 (no/negligible degradation), D-2 (minor degradation), D-3 (moderate degradation), and D-4 (severe degradation). More or fewer threshold levels of degradation may be implemented in other embodiments. As the various levels are relative, the levels for each are application specific. Likewise, application-specific low and middle states of charge, i.e., SOC-2 and SOC-1, respectively, may be used by the present method 50 to determine the above-noted rate of increase or ΔR value. For lithium-ion chemistries as noted above, the EMU 18 may use an SOC-1 of about 50% and an SOC-2 of about 10%, without limitation.

In one or more embodiments, instructions in memory 20, when executed by the processor 19, cause the processor 19 to compare the ΔR value noted above to predetermined degradation thresholds, with the traces 60 labeled D-1, D-2, D-3, and D-4 being a representative set of such predetermined degradation thresholds. The processor 19 in such an implementation may compare the ΔR value to a first degradation threshold corresponding to negligible degradation of the battery 12, e.g., D-1. The processor 19 may also compare the ΔR value to a second degradation threshold, e.g., D-2, corresponding to minor degradation of the battery 12, a third degradation threshold (D-3) corresponding to moderate degradation of the battery 12, and a fourth degradation threshold (D-4) corresponding to moderate degradation of the battery 12. The highest exceeded threshold thus indicates the degradation level.

As an illustrative example, the first degradation threshold in FIG. 6, i.e., D-1, may be about 25% to about 35%. The second degradation threshold (D-2) in this approach may be about 45% to about 55%, while the third degradation threshold (D-3) may be about 55% to about 65. The fourth degradation threshold (D-4) may be about 80% to about 90% or more. Other percentage ranges may be used in other implementations, e.g., based on the application and electrochemical composition of the battery 12. By comparing the relatively small ΔR value of degradation threshold D-1 (no degradation) to the relatively large ΔR value of degradation threshold D-4 (severe degradation), one can discern the wide variance in internal resistance that may be observed in an aged or otherwise degraded battery 12.

The method 50 of FIG. 7 is described below as a sequence of steps or logic blocks each embodied as computer-readable instructions. Such instructions may be recorded in the memory 20 of the EMU 18 shown in FIG. 1 or in another accessible non-volatile, non-transitory memory location, and executed by the processor 19 to cause the EMU 18 to perform the described functions.

The functions of the method 50 are embodied as computer-readable instructions and executed from the memory 20, for instance magnetic or optical media, CD-ROM, and/or solid-state/semiconductor memory (e.g., diverse types of RAM or ROM). The processor 19 may encompass one or more control modules, control units, microprocessor chips, Application Specific Integrated Circuit(s) (ASIC), Field-Programmable Gate Array(s) (FPGA(s)), electronic circuit(s), or central processing units. Associated memory component(s) of the memory 20 include non-transitory computer-readable storage devices such as read only memory, programmable read only memory, hard drive, etc. Non-transitory components of the memory 20 used herein are capable of storing machine-readable instructions in the form of one or more software or firmware programs or routines, combinational logic circuit(s), input/output circuit (s) and devices, signal conditioning and buffer circuitry and other components that can be accessed by one or more of the processors 19 to provide a described functionality.

In general, execution of the instructions from the memory 20 may lead to generation of the measurement request signal (CCR) shown in FIG. 1 and its transmission to the sensor array 16. This in turn causes the processor 19, and thus the EMU 18, to receive the measured battery parameters-voltage, current, and temperature—from the sensor array 16 during a predetermined operating mode of the battery 12. The sensor array 16 communicates these battery parameters to the EMU 18 as part of the input signals ($CC_{IN}$). Once the battery parameters have been communicated and received, the processor 19 calculates the internal resistance ($R_{INT}$) of the battery 12 using the battery parameters and thereafter determines the degradation level of the battery 12 using the internal resistance ($R_{INT}$). The EMU 18 may perform one or more protective actions in response to the degradation level exceeding a calibrated threshold and/or the state of health of the battery 12.

An exemplary embodiment of the method 50 is illustrated in FIG. 7. Commencing with block B52 ("Determine SOC-1, SOC-2"), the method 50 includes determining two different SOC points to use when evaluating the degradation level and state of health (SOH) of the battery 12. Such levels correspond to the first SOC (SOC-1) and the second SOC (SOC-2) of FIGS. 5 and 6, later used to calculate the ΔR value. While the actual SOC used for the respective first and second SOC (SOC-1 and SOC-2), the non-limiting example implementation of 50% and 10% is used herein for illustrative consistency.

Referring briefly again to the example traces 60 of FIG. 6, the chosen SOC values for block B52 sufficiently differ from one another such that one value, e.g., SOC-1, captures a steady-state/mid-range of the trajectory and the other value, in this case SOC-2, corresponds to a falling (or rising) tail of the trajectory. The EMU 18 may be programmed with a calibrated first SOC (SOC-1) level of about 25% to about 75% and a calibrated second SOC level (SOC-2) of about 0 to 25% in keeping with the representative trajectories of FIG. 6, with the exemplary 50% and 10% levels falling within these broader ranges.

To determine the actual SOC of the battery 12, the EMU 18 of FIG. 1 via its processor 19 may determine the actual SOC of the battery 12 at a predetermined temperature, for instance at 25° C. or another application-specific operating temperature. The SOC may be determined via the SOC block 33 of FIG. 3, for instance using Coulomb counting, machine learning, voltage and temperature-based lookup tables, open circuit voltage (OCV)-to-SOC curves, or other possible approaches as noted above. The temperature measurement block 42 described above with reference to FIG. 3 may be used to ascertain the temperature of the battery 12.

Factors in choosing SOC-1 and SOC-2 include the composition or construction of the battery 12. For instance, plot 55 and traces 60 of respective FIGS. 5 and 6 may be generated offline for the battery 12 and used to determine the optimal values for SOC-1 and SOC-2. These values are then programmed into memory 20. The method 50 thereafter proceeds to block B54.

At block B54 (SOC=SOC-1 or SOC-2), the EMU 18 of FIG. 1 waits until the actual SOC of the battery 12 reaches the first SOC (SOC-1) or the second SOC (SOC-2) recorded in block B52. The method 50 waits at block B54 until the first or second SOC (SOC-1 or SOC-2) has been reached before proceeding to block B56.

Block B56 ("Determine $R_{INT}$@SOC-1 or SOC-2") includes determining the internal resistance ($R_{INT}$) at the SOC level detected at block B54, i.e., SOC-1 or SOC-2. Battery parameters measured as part of block B56 include the battery voltage (VB) and current (IB) of FIG. 4, e.g., via blocks 35 and 39, respectively. Open circuit voltage (OCV) information is then extracted at the SOC level, i.e., SOC-1 or SOC-2, for instance from a lookup table or curves such as the plot 55 of FIG. 5. Such information may be stored in memory 20 of the EMU 18 (FIG. 1) during performance of the method 50.

To calculate the internal resistance ($R_{INT}$), the processor 19 of the EMU 18 may solve the following equations:

$$R1 = \frac{OCV1 - V1}{IDD1}$$

$$R2 = \frac{OCV2 - V2}{IDD2}$$

where subscripts 1 and 2 represented the values taken at SOC-1 and SOC-2 respectively, R1 and $R^2$ are the internal resistances of the battery 12, V1 and V2 correspond to the battery voltage (VB) of FIG. 4, and IDD1 and IDD2 correspond to the measured battery current (IB) of FIG. 4. When the predetermined operating mode of the battery 12 when the method 50 is performed is a discharging mode, the OCV will exceed the battery voltage, i.e., OCV>V. The opposite relationship holds during a charging mode, i.e., V>OCV. The method 50 proceeds to block B58 after determining the internal resistance ($R_{INT}$).

At block B58 ("ΔR Ratio (%)>CAL?") entails performing a ΔR ratio level check via the EMU 18 of FIG. 1. As part of block B58, the processor 19 may calculate a rate of increase of the internal resistance, i.e., $R_{INT}$, of the battery 12 of FIG. 1 across the different states of charge of the battery 12, i.e., SOC-1 and SOC-2. For example, the EMU 18 may calculate the ΔR value as a delta resistance (ΔR) ratio, with the ΔR ratio being a function (*f*) of the first internal resistance (R1) and the second resistance (R2). As part of the present approach, therefore, the EMU 18 may determine the degradation level of the battery 12 using the ΔR ratio. Numerous examples of the ΔR ratio are illustrated in FIG. 6. The processor 19 may calculate the ΔR ratio using the following function (*f*):

$$f = \Delta R \text{ ratio } (\%) = \frac{\Delta R}{R1} \cdot 100\%$$

where ΔR is equal to R2–R1.

Still referring to FIG. 7 and the representative embodiment of the method 50, the EMU 18 as part of block B58 determines if the ΔR ratio exceeds one or more calibrated degradation thresholds. A possible implementation includes setting a single degradation level, e.g., D-4 of FIG. 6 corresponding to severe degradation or multiple degradation thresholds each progressively escalating in severity. As an example of the latter, four example thresholds are illustrated in FIG. 6 and labeled D-1 (no degradation or negligible degradation), D-2 (minor degradation), D-3 (moderate degradation), and D-4 (severe degradation). More or fewer threshold levels of degradation may be implemented in other embodiments.

Thus, block B58 may entail comparing the ΔR ratio to a single degradation threshold, e.g., D-4, or to several different graduated degradation thresholds, e.g., D-1, D-2, D-3, and D-4. The latter approach would have the benefit of providing a metric of the true state of health (SOH) of the battery 12 at a given point in time short of battery failure. For instance, the EMU 18 may record the exceeded degradation threshold in its memory 20 of FIG. 1 to build a performance history of the battery 12, with the degradation trend being available as a metric to enable a more proactive response. The method 50 proceeds to block B60 when the ΔR ratio value has exceeded a degradation threshold and returns to block B54 in the alternative when a degradation threshold has not been exceeded.

At block B60 ("Execute Control Action"), the EMU 18 of FIG. 1 may execute a control action of the battery 12 in response to the registering the degradation level. This action occurs using the above-described degradation level determination, based on whether the battery 12 is sufficiently healthy to continue its use without intervention. For example, the EMU 18 may determine which of the degradation thresholds of FIG. 6 were exceeded to select an appropriate response. When exceeding representative degradation threshold D-1 of FIG. 6, for example, the EMU 18 may begin to monitor the state of health (SOH) of the battery 12 more closely, knowing that the SOH remains acceptably high but has begun to degrade. In contrast, the EMU 18 in the same example may begin to escalate its control or preventive response actions when the degradation threshold D-2 or D-3 have been exceeded, with more aggressive control or preventive actions being initiated when the highest degradation threshold D-4 has been exceeded.

In some embodiments, each degradation threshold may be associated with a particular preventive control action. "Preventive" as contemplated herein refers to an action that notifies a user of the battery electric system 10 of FIG. 1 that the SOH or performance of the battery 12 is compromised in some way. When the battery 12 has degraded to only a mild extent, the preventive action may take on a less urgent tone or mechanism, typically without the EMU 18 intervening in operation of the battery 12. Text messages, audio/visual alerts, or other information may be communicated to the user in such an instance. However, as the degradation level becomes more significant, e.g., when exceeding exemplary degradation thresholds D-3 or D-4 of FIG. 6, the EMU 18 may escalate the preventive action response in terms of its urgency, as well as possibly intervening in the control of the battery 12 itself.

Communication within the scope of block B68 may include transmitting a state of health (SOH) notice to a remote device, e.g., transmitting an electronic alert signal to the GUI 24 of FIG. 1. Distinct levels of alerts or warning messages may be communicated this way. An alert message communicated by the EMU 18 in response to a less urgent condition is itself less urgent in comparison to the alert message communicated in response to the more urgent condition.

Using an illustrative example, an SMS text message may be transmitted to the GUI 24 recommending replacement or service of the battery 12 within an extended timeframe or with unspecified urgency, e.g., "battery approaching end of useful life-service recommended." If the battery electric system 10 of FIG. 1 is so equipped, a light or lamp may be lit with a corresponding color such as amber or yellow to visually alert users to the partially degraded but still functional state of the battery 12. The urgency of the alert/messaging may be likewise elevated when exceeding the highest t degradation thresholds. For example, a more urgent phrasing such as "battery condition poor-immediate service recommended" may be used in lieu of the above text example. The optional light may be illuminated in a universally understood color such as red in this example, and/or a light may be caused to pulsate or blink to elevate the alert status in a discernable manner. Audible warning tones may likewise be sounded to draw a user's attention to the possible imminent failure of the battery 12.

At some point, the EMU 18 of FIG. 1 may determine that continued use of the battery 12 would be potentially detrimental to the health and safety of the battery electric system 10 and possible users thereof. In this instance, the EMU 18 may be caused to execute the protective action by commanding the disconnect switch 14 (FIG. 1) to open and thereby disconnect the battery 12 from the load 11 (or 111). Opening of the disconnect switch 14 effectively removes the battery 12 from a voltage bus connecting the battery 12 to the load 11/111, and therefore protects the load 11/111 from a discharge of power from the now-disconnected battery 12. Similarly, the EMU 18 may prevent the charging switch 30 from closing to prevent charging operations, for instance by transmitting an override or bypass signal to control logic of the battery charger 13 and/or charging switch 30. The battery 12 is thus isolated from the charging and discharging sides of the battery electric system 10.

Using the method 50 or embodiments thereof, high-energy batteries may be safely managed in a host of applications. The solutions presented herein use a relationship between internal resistance and SOC to enable early detection of potentially hazardous states of such batteries, e.g., the battery 12 of FIG. 1. Electrode structure changes, for instance physical and chemical transformations such as the formation of solid-electrolyte interphase (SEI) layers or electrode degradation in a lithium-ion construction, cause an increase in internal resistance to ion flow within the battery 12. At lower capacities, there are fewer lithium ions available for transport between electrodes during charge and discharge cycles. This in turn can increase resistance within the electrolyte and at electrode interfaces of the battery 12, leading to higher overall internal resistance. Similarly, voltage drops at lower capacities become more significant, resulting in polarization effects that manifest as higher internal resistance. The method 50 thus acts using the internal resistance and SOC relationship when monitoring the state of health of the battery 12, e.g., by monitoring the relative trend in internal resistance at different states of charge, nominally SOC-1 and SOC-2.

Levels of degradation may be represented as numeric SOH values, for instance with an SOH of "1" corresponding to a perfectly healthy battery 12 and an SOH of "0" corresponding to a fully degraded/inoperable battery 12. Values in between the normalized extremes of this exemplary range may correspond to progressively deteriorated states of the battery, e.g., the battery 12 described herein, with an SOH value closer to 0 being more degraded than those lying closer to an SOH value of 1. Those skilled in the art now having the benefit of the foregoing disclosure will appreciate these and other benefits of the present teachings.

While several modes for carrying out the present teachings have been described in detail, those familiar with the art to which these teachings relate will recognize various alternative aspects for practicing the present teachings that are within the scope of the appended claims. The above description and accompanying drawings are illustrative and exemplary of the entire range of alternative embodiments that an ordinarily skilled artisan would recognize as implied by, structurally and/or functionally equivalent to, or otherwise rendered obvious based upon the included content, and not as limited solely to those explicitly depicted and/or described embodiments. Moreover, the present concepts expressly include combinations and sub-combinations of the described elements and features. The detailed description and the drawings are supportive and descriptive of the present teachings, with the scope of the present teachings defined solely by the claims.

What is claimed is:

1. A system for monitoring a battery of a battery electric system, the system comprising:

a sensor array configured to measure a voltage, a current, and a temperature of the battery as a set of battery parameters;

a processor; and a non-transitory computer-readable storage medium ("memory"), the memory including instructions executable by the processor to cause the processor to:

receive the set of battery parameters from the sensor array during a predetermined operating mode of the battery, the predetermined operating mode being a charging mode of the battery or a discharging mode of the battery;

calculate, using the set of battery parameters, an internal resistance of the battery at two different states of charge of the battery;

calculate, using the internal resistance of the battery at the two different states of charge of the battery, a rate of increase of an internal resistance of the battery across the two different states of charge of the battery as a delta resistance (AR) ratio;

determine a degradation level of the battery using the AR ratio, including comparing the delta resistance (AR) ratio to a plurality of degradation thresholds; and execute a control action of the battery in response to the degradation level, including:

recording the degradation level of the battery in the memory; and when the degradation level exceeds a predetermined one of the plurality of degradation thresholds: (i) commanding a disconnecting of the battery from a load, or (ii) commanding prevention of charging of the battery.

2. The system of claim 1, wherein the instructions are executable by the processor to cause the processor to:

calculate a first internal resistance (R1) of the battery at a first state of charge (SOC-1) of the battery using the battery parameters;

calculate a second internal resistance (R2) of the battery at a second state of charge (SOC-2) of the battery using the battery parameters, the first state of charge (SOC-1) exceeding the second state of charge (SOC-2); and calculate the ΔR ratio as a function ($f$) of the first internal resistance (R1) and the second resistance (R2), wherein $f=(R2-R1)/R1\times 100\%$.

3. The system of claim 1, wherein the instructions are executable by the processor to cause the processor to:

execute the control action of the battery in response to the degradation level, the control action including transmitting a state of health notice to a remote device.

4. The system of claim 1, wherein the instructions are executable by the processor to cause the processor to compare the AR ratio to the plurality of degradation thresholds by comparing the AR ratio to each of:

(i) a first degradation threshold corresponding to negligible degradation of the battery;

(ii) a second degradation threshold corresponding to minor degradation of the battery;

(iii) a third degradation threshold corresponding to moderate degradation of the battery; and (iv) a fourth degradation threshold corresponding to severe degradation of the battery.

5. The system of claim 4, wherein the first degradation threshold is about 25% to about 35%, the second degradation threshold is about 45% to about 55%, the third degradation threshold is about 55% to about 65%, and the fourth degradation threshold is about 80% to about 90%, and wherein the predetermined one of the degradation thresholds is the fourth degradation threshold.

6. The system of claim 1, wherein the battery includes a lithium-ion battery pack, and wherein the instructions are executable by the processor to cause the processor to:

calculate the AR ratio of the battery across a first state of charge (SOC-1) of about 50% and a second state of charge (SOC-2) of about 10%, and wherein the two different states of charge include the first state of charge (SOC-1) and the second state of charge (SOC-2).

7. The system of claim 1, wherein the control action includes disconnecting the battery from the load, the system further comprising:

an electrical disconnect switch, wherein the battery is connectable to a load via the electrical disconnect switch, and wherein the instructions are executable by the processor to cause the processor to command the electrical disconnect switch to open and thereby disconnect the battery from the load in response to the predetermined degradation level of the battery.

8. A method for monitoring a battery in a battery electric system, the method comprising:
measuring a set of battery parameters of the battery using a sensor array of a battery monitoring system;
calculating an internal resistance of the battery at two different states of charge of the battery during a charging mode or a discharging mode of the battery;
calculating, via a processor of the battery monitoring system using the internal resistance, a rate of increase of an internal resistance (ΔR ratio) of the battery across the two different states of charge of the battery;
determine a corresponding degradation level of the battery using the ΔR ratio by comparing the ΔR ratio to a plurality of degradation thresholds;
recording the corresponding degradation level of the battery in memory of the battery monitoring system; and
executing a control action of the battery in response to the recording the corresponding degradation level, the control action including transmitting a state of health notice to a remote device, and, when the degradation level exceeds a predetermined threshold that is one of the plurality of degradation thresholds:
(i) commanding a disconnecting of the battery from a load, or (ii) commanding prevention of charging of the battery.

9. The method of claim 8, wherein the sensor array includes a voltage sensor, a current sensor, and a temperature sensor, and wherein measuring the set of battery parameters of the battery using the sensor array includes measuring a voltage, a current, and a temperature of the battery via the voltage sensor, the current sensor, and the temperature sensor, respectively.

10. The method of claim 9, further comprising:
calculating a first internal resistance (R1) of the battery at a first state of charge (SOC-1) of the battery using the voltage, the current, and the temperature;
calculating a second internal resistance (R2) of the battery at a second state of charge (SOC-2) of the battery using the voltage, the current, and the temperature, wherein the multiple states of charge of the battery include the first state of charge (SOC-1) of the battery and the second state of charge (SOC-2) of the battery, the two different states of charge including the first state of charge (SOC01) and the second state of charge (SOC-2);
calculating the ΔR ratio as a function ($f$) of the first internal resistance (R1) and the second resistance (R2); and
determining the degradation level of the battery by comparing the ΔR ratio to the one or more predetermined degradation thresholds, wherein $f=(R2-R1)/R1\times 100\%$.

11. The method of claim 10, wherein determining the degradation level of the battery by comparing the ΔR ratio to the one or more predetermined degradation thresholds includes comparing the ΔR ratio to a single degradation threshold.

12. The method of claim 11, wherein:
comparing the ΔR ratio to the plurality of the degradation thresholds includes comparing the ΔR ratio to:
(i) a first degradation threshold corresponding to negligible degradation of the battery;
(ii) a second degradation threshold corresponding to minor degradation of the battery;
(iii) a third degradation threshold corresponding to moderate degradation of the battery; and
(iv) a fourth degradation threshold corresponding to severe degradation of the battery.

13. The method of claim 12, wherein the first degradation threshold is about 25% to about 35%, the second degradation threshold is about 45% to about 55%, the third degradation threshold is about 55% to about 65%, and the fourth degradation threshold is about 80% to about 90%, and wherein the predetermined threshold is the fourth degradation threshold.

14. The method of claim 10, wherein the battery includes a lithium-ion battery pack, the first state of charge (SOC-1) is about 50%, and the second state of charge (SOC-2) is about 10%.

15. The method of claim 8, wherein the control action includes disconnecting the battery from the load, and wherein the battery electric system includes an electrical disconnect switch and the battery is connectable to the load via the electrical disconnect switch, the method further comprising:
commanding the electrical disconnect switch to open and thereby disconnect the battery from the load in response to the degradation level of the battery.

16. A battery electric system for powering a load, comprising:
an electrical disconnect switch;
a battery that is selectively connectable to the load via the electrical disconnect switch;
a sensor array connected to the battery and configured to measure a voltage, a current, and a temperature of the battery as battery parameters; and
an electronic monitoring unit (EMU) having a processor and a non-transitory computer-readable storage medium ("memory"), the memory including instructions executable by the processor to cause the EMU to:
receive the battery parameters from the sensor array during a predetermined operating mode of the battery, the predetermined operating mode including a charging mode of the battery or a discharging mode of the battery;
calculate a first internal resistance (R1) of the battery at a first state of charge (SOC-1) of the battery using the battery parameters;
calculate a second internal resistance (R2) of the battery at a second state of charge (SOC-2) of the battery using the battery parameters, the first state of charge (SOC-1) exceeding the second state of charge (SOC-2);
calculate a delta resistance (ΔR) ratio as a function ($f$) of the first internal resistance (R1) and the second resistance (R2), wherein $f=(R2-R1)/R1\times 100\%$;
determine the degradation level of the battery using the ΔR ratio; and
execute a control action of the battery in response to the degradation level, including, when the degradation level exceeds a predetermined threshold that is one of the degradation thresholds: (i) commanding a disconnecting of the battery from the load, or (ii) commanding preventing a charging of the battery.

17. The battery electric system of claim 16, further comprising: the load.

18. The battery electric system of claim 17, wherein the load includes a wearable medical device.

19. The battery electric system of claim 16, wherein the instructions are executable by the processor to cause the EMU to compare the ΔR ratio to:
(i) a first degradation threshold corresponding to negligible degradation of the battery;

(ii) a second degradation threshold corresponding to minor degradation of the battery;

(iii) a third degradation threshold corresponding to moderate degradation of the battery; and (iv) a fourth degradation threshold corresponding to severe degradation of the battery.

20. The battery electric system of claim 19, wherein the EMU is configured, as the control action in response to the degradation level exceeding the fourth degradation threshold, to command the electrical disconnect switch to open and thereby disconnect the battery from the load.

* * * * *